United States Patent
Parkhe et al.

(10) Patent No.: US 12,224,198 B2
(45) Date of Patent: *Feb. 11, 2025

(54) ELECTROSTATIC CHUCK WITH MESAS

(71) Applicant: Applied Materials, Inc., Santa Clara, CA (US)

(72) Inventors: Vijay D. Parkhe, San Jose, CA (US); Ashutosh Agarwal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/584,937

(22) Filed: Feb. 22, 2024

(65) Prior Publication Data

US 2024/0242997 A1 Jul. 18, 2024

Related U.S. Application Data

(63) Continuation of application No. 17/686,324, filed on Mar. 3, 2022, now Pat. No. 11,955,361.

(60) Provisional application No. 63/175,218, filed on Apr. 15, 2021.

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32715* (2013.01); *H01L 21/68757* (2013.01)

(58) Field of Classification Search
CPC ............ H01L 21/6833; H01L 21/68757; H01J 37/32715

USPC .......................................................... 361/234
See application file for complete search history.

(56) References Cited

U.S. PATENT DOCUMENTS

| | | | |
|---|---|---|---|
| 8,617,672 | B2 | 12/2013 | Bhatnagar et al. |
| 9,481,608 | B2 | 11/2016 | Bhatnagar et al. |
| 2001/0043452 | A1 | 11/2001 | Divakar et al. |
| 2002/0027762 | A1 | 3/2002 | Yamaguchi |
| 2016/0336210 | A1* | 11/2016 | Cooke ............... H01L 21/67248 |
| 2017/0014970 | A1 | 1/2017 | Itoyama et al. |
| 2017/0140970 | A1* | 5/2017 | Boyd, Jr. ................ C03C 17/00 |

(Continued)

FOREIGN PATENT DOCUMENTS

| | | | | |
|---|---|---|---|---|
| CN | 102237292 A | * | 11/2011 | ......... H01L 21/6833 |
| JP | 2003516635 A | | 5/2003 | |
| JP | 2017507484 A | | 3/2017 | |

(Continued)

OTHER PUBLICATIONS

Machine translation of Fujisawa et al. Chinese Patent Document CN 102237292 A Nov. 2011 (Year: 2011).*

(Continued)

*Primary Examiner* — Kevin J Comber

(74) *Attorney, Agent, or Firm* — Schwabe, Williamson & Wyatt, P.C.

(57) ABSTRACT

Electrostatic chucks (ESCs) for plasma processing chambers, and methods of fabricating ESCs, are described. In an example, a substrate support assembly includes a ceramic top plate having a top surface with a processing region. One or more electrodes is within the ceramic top plate. A plurality of mesas is within the processing region and on the top surface of the ceramic plate or vertically over an edge of one of the one or more electrodes.

18 Claims, 8 Drawing Sheets

(56) References Cited

U.S. PATENT DOCUMENTS

2018/0254211 A1 9/2018 Kosakai et al.
2020/0243368 A1 7/2020 Boyd, Jr. et al.

FOREIGN PATENT DOCUMENTS

| JP | 2017212332 A | * | 11/2017 |
| KR | 10-2011-0119092 | | 11/2011 |
| TW | 2017-31131 A | | 9/2017 |
| TW | 202040729 A | | 11/2020 |

OTHER PUBLICATIONS

Machine translation of Fukazawa et al. Japanese Patent Document JP 2017-212332 A Nov. 2017 (Year: 2017).*
International Search Report and Written Opinion from PCT/US2022/023552 dated Jul. 25, 2022, 12 pgs.
Non-Final Office Action from U.S. Appl. No. 17/686,324 dated May 19, 2023, 17 pgs.
Final Office Action from U.S. Appl. No. 17/686,324 dated Sep. 7, 2023, 13 pgs.
International Preliminary Report on Patentability from PCT/US2022/023552 dated Oct. 26, 2023, 7 pgs.
Official Letter from Taiwan Patent Application No. 111113186 dated Dec. 14, 2023, 11 pgs.
Office Action for Korean Patent Application No. 10-2023-7039118, dated Nov. 28, 2024, 13 pages.
Office Action for Taiwan Patent Application No. 113134565, Dated Nov. 12, 2024, 12 pages.
Notice of Reasons for Rejection for Japanese Patent Application No. 2023-563200, dated Dec. 17, 2024, 8 pgs.

* cited by examiner

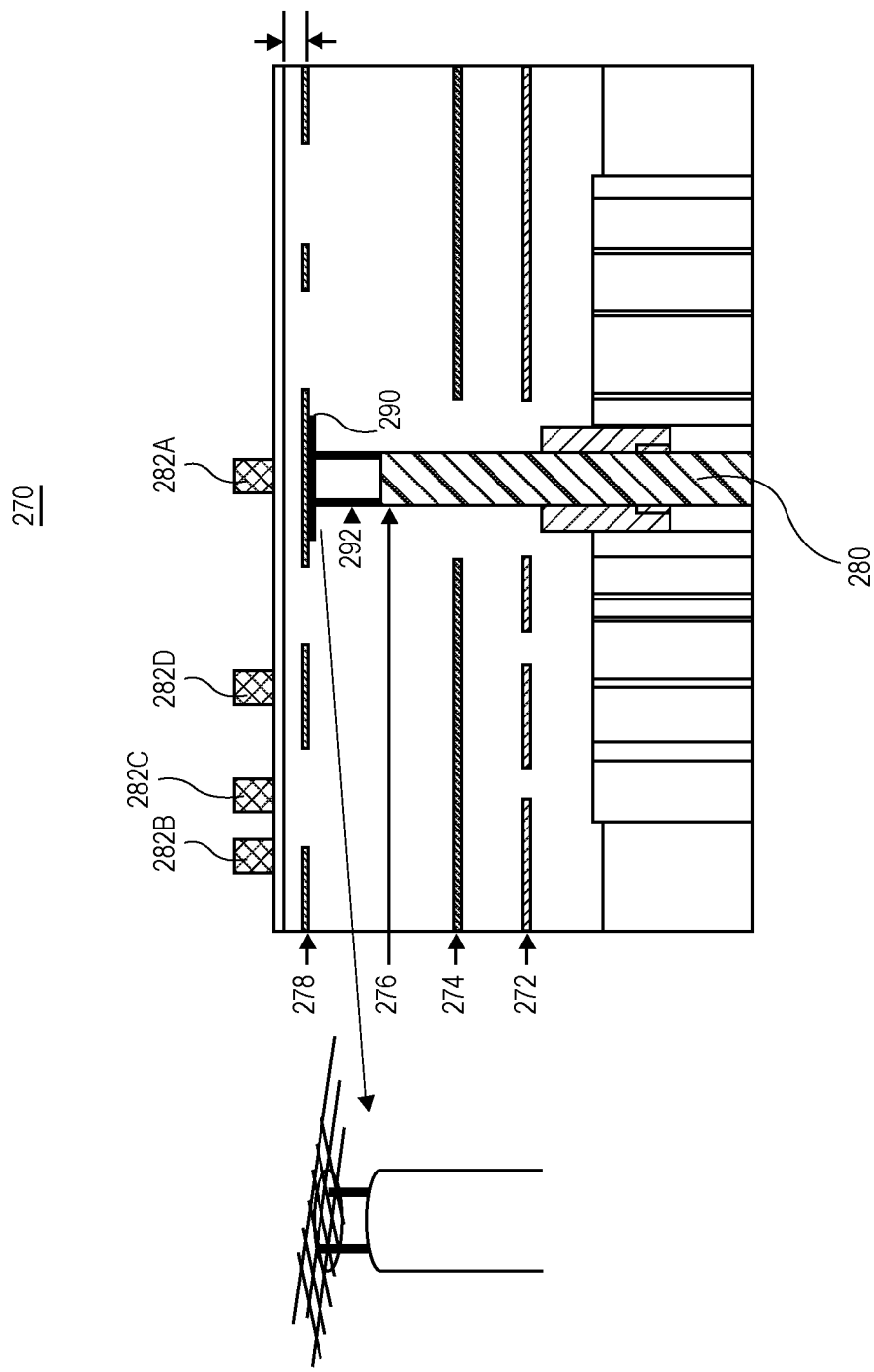

ELECTROSTATIC CHUCK WITH MESAS

CROSS-REFERENCE TO RELATED APPLICATIONS

This application is a continuation of U.S. patent application Ser. No. 17/686,324 filed on Mar. 3, 2022, which claims the benefit of U.S. Provisional Application No. 63/175,218, filed on Apr. 15, 2021, the entire contents of which are hereby incorporated by reference herein.

BACKGROUND

1) Field

Embodiments of the present disclosure pertain to the field of reactor or plasma processing chambers and, in particular, to electrostatic chucks with mesas.

2) Description of Related Art

Processing systems such as reactors or plasma reactors are used to form devices on a substrate, such as a semiconductor wafer or a transparent substrate. Often the substrate is held to a support for processing. The substrate may be held to the support by vacuum, gravity, electrostatic forces, or by other suitable techniques. During processing, the precursor gas or gas mixture in the chamber is energized (e.g., excited) into a plasma by applying a power, such as a radio frequency (RF) power, to an electrode in the chamber from one or more power sources coupled to the electrode. The excited gas or gas mixture reacts to form a layer of material on a surface of the substrate. The layer may be, for example, a passivation layer, a gate insulator, a buffer layer, and/or an etch stop layer.

In the semiconductor and other industries, electrostatic chucks (ESC) are used to hold a workpiece such as substrates on supports during processing of the substrate. A typical ESC may include a base, an electrically insulative layer disposed on the base, and one or more electrodes embedded in the electrically insulative layer. The ESC may be provided with an embedded electric heater, as well as be fluidly coupled to a source of heat transfer gas for controlling substrate temperature during processing. During use, the ESC is secured to the support in a process chamber. The electrode in the ESC is electrically biased with respect to a substrate disposed on the ESC by an electrical voltage source. Opposing electrostatic charges accumulate in the electrode of the ESC and on the surface of the substrate, the insulative layer precluding flow of charge there between. The electrostatic force resulting from the accumulation of electrostatic charge holds the substrate to the ESC during processing of the substrate.

SUMMARY

Embodiments of the present disclosure include electrostatic chucks (ESCs) for plasma processing chambers, and methods of fabricating ESCs.

In an embodiment, a substrate support assembly includes a ceramic top plate having a top surface with a processing region. One or more electrodes is within the ceramic top plate. A plurality of mesas is within the processing region and on the top surface of the ceramic plate or vertically over an edge of one of the one or more electrodes.

In an embodiment, a substrate support assembly includes a ceramic top plate having a top surface with a processing region. The top surface has one or more high topography regions. A plurality of mesas is within the processing region and on the top surface of the ceramic plate. None of the plurality of mesas are on the one or more high topography regions of the top surface of the processing region.

In an embodiment, a substrate support assembly includes a ceramic top plate having a top surface with a processing region. The top surface has one or more high stress regions. A plurality of mesas is within the processing region and on the top surface of the ceramic plate. None of the plurality of mesas are on the one or more high stress regions of the top surface of the processing region.

BRIEF DESCRIPTION OF THE DRAWINGS

FIG. 2C illustrates a cross-sectional view of another electrostatic chuck (ESC) including mesas in various locations, in accordance with another embodiment of the present disclosure.

DETAILED DESCRIPTION

Electrostatic chucks (ESCs) for plasma processing chambers, and methods of fabricating ESCs, are described. In the following description, numerous specific details are set forth, such as electrostatic chuck components and material regimes, in order to provide a thorough understanding of embodiments of the present disclosure. It will be apparent to one skilled in the art that embodiments of the present disclosure may be practiced without these specific details. In other instances, well-known aspects, such as plasma enhanced chemical vapor deposition (PECVD) or plasma enhanced atomic layer deposition (PEALD) processes, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed to reducing surface stress in electrostatic chucks (ESCs) by mesa engineering, profile and ESC material design. Embodiments can include ESC mesa engineering and top material structure design.

To provide context, mesas on a surface of an ESC can be used to a support workpiece as slightly raised from a global top surface of a top plate of an ESC. In exemplary embodiments, mesa coverage can be approximately 65% of the total surface area of a process surface, but can be greater or less. Mesas can be approximately 15 microns tall, but can be taller or shorter. Mesas can be approximately 1 mm in diameter, but can be larger or smaller. In the past and in state-of-the-art implementations, mesas are typically placed in many locations including locations based on high stress regions on the surface of the ESC. Placement in such high stress areas can involve cracking on a top surface of the ESC due to thermal stress in high stress and/or defective areas.

In accordance with one or more embodiments of the present disclosure, mesa engineering and profile configurations of a top ESC material and design are implemented for surface stress reduction. Advantages to implementing one or more embodiments described herein can include targeted location of mesas, improved profiles of a top surface of an ESC. Embodiments described herein can be implemented to enable use of an ESC without cracking due to thermal shock on a top surface at temperatures higher than 500C. Embodiments described herein can be implemented to remove or mitigate ESC thermal shock stress cracking.

Figure 1:
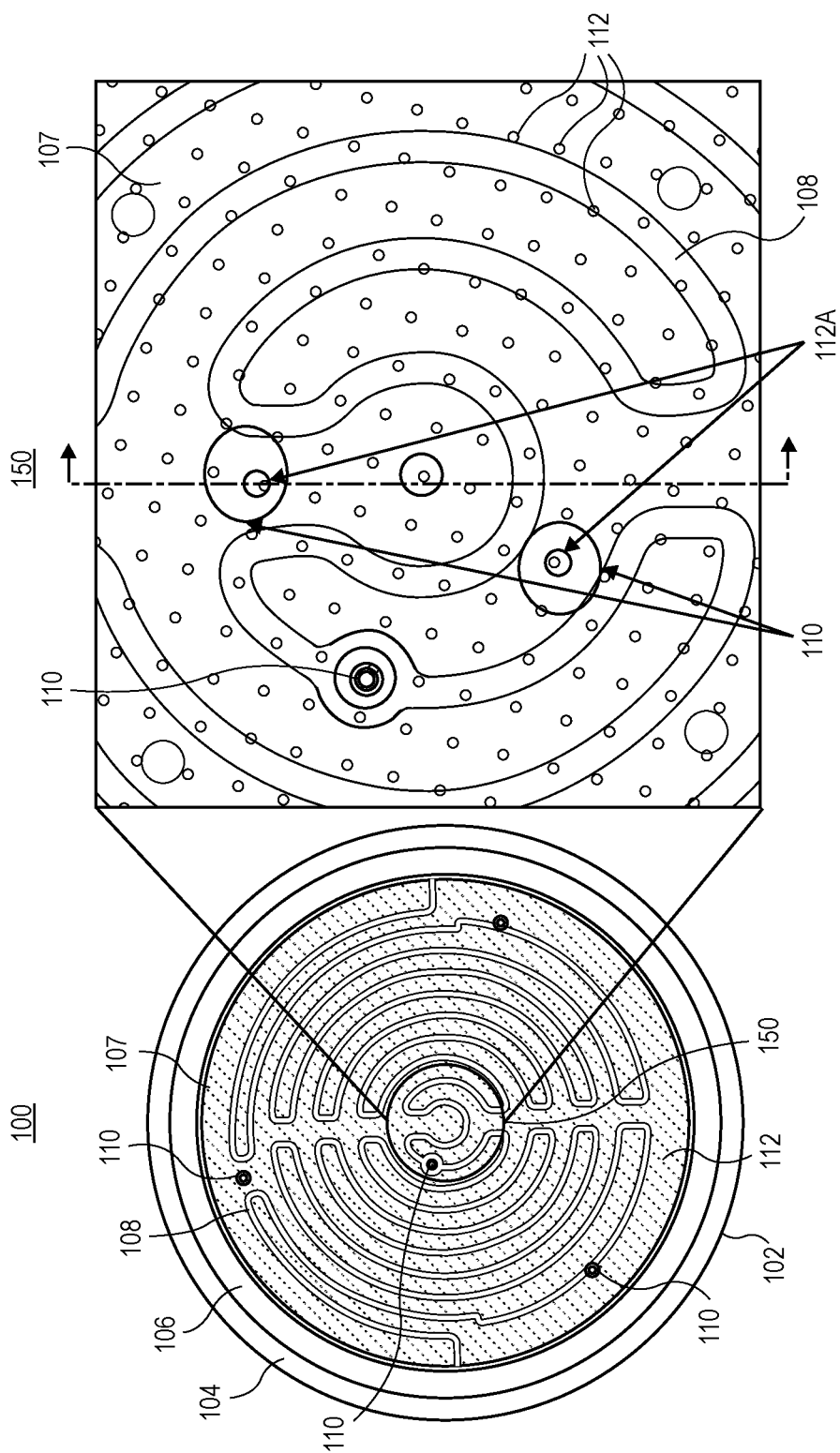
FIG. 1 illustrates a plan view and corresponding enlarged view of a top surface of an electrostatic chuck (ESC).

An ESC surface can have mesas fabricated on a top surface, e.g., by either grinding or by bead blasting. Such mesas can be described as being continuous with the top surface of a ceramic top plate. Mesas may be formed within a ceramic surface or may be particles, such as diamond particles, added to a ceramic surface. FIG. 1 illustrates a plan view and corresponding enlarged view 150 of a top surface of an electrostatic chuck (ESC).

Referring to FIG. 1, a top surface 102 of an ESC 100 includes an outer region 104 surrounding an inner region 106. The top surface 102 can be a ceramic surface, such as an aluminum nitride of aluminum oxide surface. Inner region 106 can include a processing region 107 having electrode wiring 108 therein, such as slightly below the surface of the ceramic. The electrode wiring 108 can be for, e.g., an electrostatic electrode of the ESC 100. The processing region 107 can also include DC braze joint locations 110, such as slightly below the surface of the ceramic. A plurality of mesas 112 are fabricated in the surface of the processing region 107.

Referring again to FIG. 1, and the enlarged view 150 in particular, the plurality of mesas 112 includes mesas in numerous locations including in benign regions, but also mesas 112A in regions over regions of the DC braze joint locations 110. It has been determined that the mesas 112A in the regions over regions of the DC braze joint locations 110 can place the mesa 112A in a high stress area.

Figure 2A:
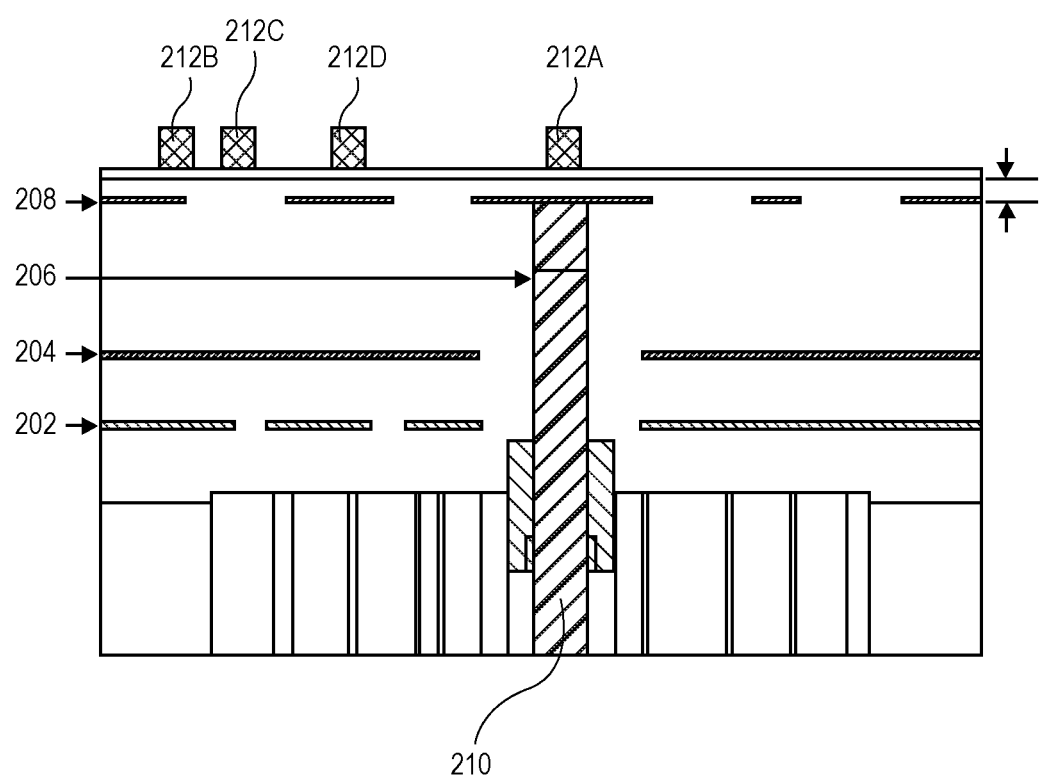
FIG. 2A illustrates a cross-sectional view of an electrostatic chuck (ESC) including mesas in various locations, in accordance with an embodiment of the present disclosure.

FIG. 2A illustrates a cross-sectional view of an electrostatic chuck (ESC) including mesas in various locations, in accordance with an embodiment of the present disclosure.

Referring to FIG. 2A, and ESC 200 includes a center zone 202, a main zone 204, a DC rod 206, and an ESC mesh 208. The DC rod 206 can be in a central location 210 as is depicted. The ESC 200 also includes mesas, such as mesas 212A, 212B, 212C and 212D. The mesa 212A is over a high voltage connection area 210 such as over DC rod 206. The mesa 212B is over an electrode edge. The mesa 212C is in a no electrode area. The mesa 212D is fully over an electrode. The mesas 212A, 212B, 212C and 212D are over a relatively shallow distance to the ESC mesh 208.

With reference again to FIG. 2A, an ESC surface can include stress distribution including high stress regions and low stress regions on a top surface based on its manufacturing features. Some high stress regions are created by the presence of a high voltage electrode approximately 1 mm under the top surface. For example, high stress can be present (A) at a boundary of an electrode edge of positive or negative polarity, (B) above braze connections, and/or at an edge of the ESC. In accordance with an embodiment of the present disclosure, mesa structures are included over low stress areas but are not included over high stress regions. For example, mesas 212A and 212B are in high stress locations, while mesas 212C and 212D are in low stress regions. In an embodiments, mesas are included in locations 212C and/or 212D but not in locations 212A or 212B.

In another aspect, state-of-the-art ESC surfaces can have a profile after machining and/or polishing a top surface. The profile can have a bump in the center of the ESC. The magnitude of such a bump in the center can be about 10-20 microns, with a 15 micron mesa following the contour, as exemplified in FIG. 2B, described below. When a wafer is placed on the ESC it can have various contact points. A bump in the center can cause a wafer to not contact mesas in the immediate vicinity of the center. In accordance with one or more embodiments of the present disclosure, a specification of amplitude of vertical (topographical features) of a surface with respect to a horizontal distance for given mesa height is determined. Heat transfer between a wafer and ESC and heat transfer from a plasma to wafer via gas coupling to the ESC can control wafer temperature in the area. When only a center bump is polished, the wafer can produce a concave contact area with all mesas and heat transfer being uniform. In one embodiment, before mesas are created, a flatness profile is measured on the surface of the ESC and mesas are not formed in locations where a vertical slope (e.g., 15 microns/10 mm) is not met.

Figure 2B:
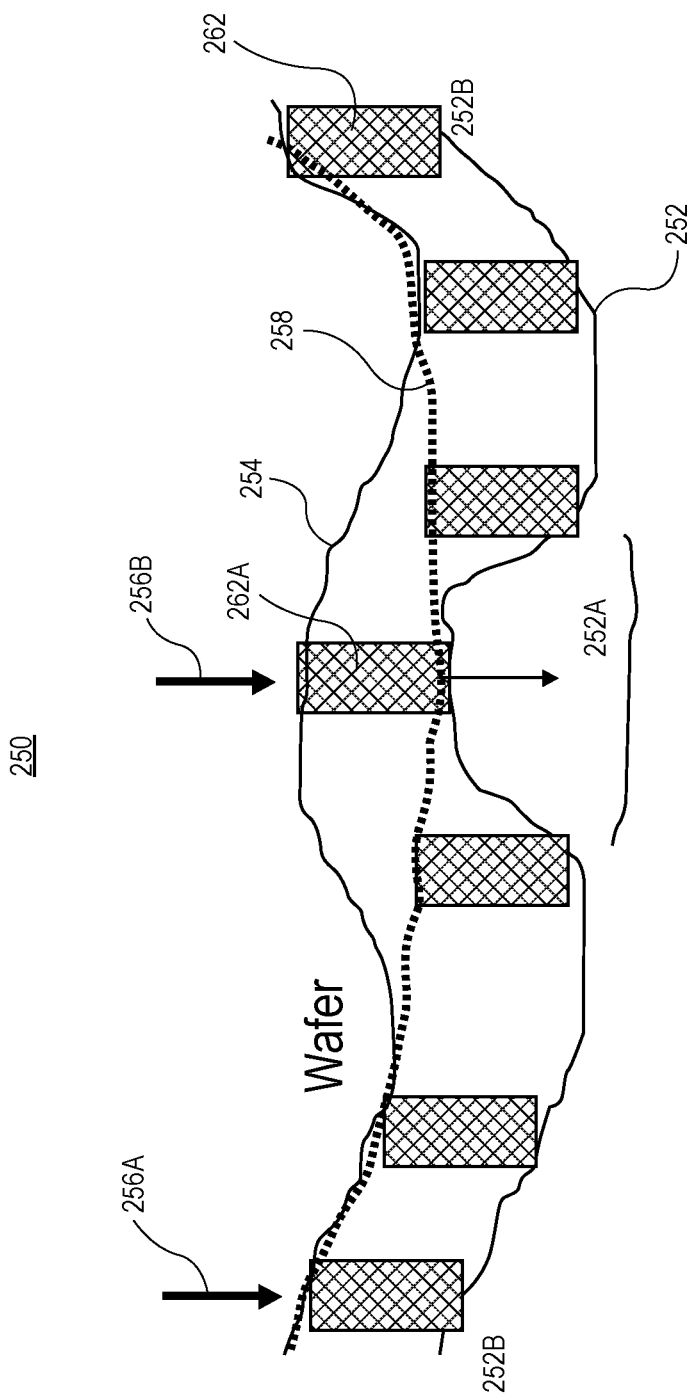
FIG. 2B illustrates a cross-sectional view of another electrostatic chuck (ESC) including mesas in various locations, in accordance with another embodiment of the present disclosure.

FIG. 2B illustrates a cross-sectional view of another electrostatic chuck (ESC) including mesas in various locations, in accordance with another embodiment of the present disclosure.

Referring to FIG. 2B, a support surface topography 250 can include a mesa profile 254 over a ceramic top surface profile 252. The ceramic top surface profile 252 can have a central high point 252A as well as edge locations 252B. The mesa profile 254 can exhibit grind locations 256A and 256B, with a high central point. Mesas 262 are on the ceramic top surface profile 252. In an embodiment, after determining that the central point is a high point, a mesa 262A is not formed in the central location. As a result a wafer profile (dotted line 258) is not formed on a high point of a mesa profile 254 that would otherwise include mesa 262A.

In an embodiment, a top layer above high voltage electrode is made thicker than 1 mm less than 3 mm to strengthen the top surface and reduce surface stress of an AlN ESC. In an embodiment, brazed high voltage connections are 2-4 mm from the top surface to reduce stress. In an embodiment, a top layer above the electrode is made up of high resistivity and high thermal shock resistance. In an embodiment, a microstructural design provides thermal shock resistance of 400C or more.

With reference again to FIGS. 1, 2A and 2B, in accordance with an embodiment of the present disclosure, a substrate support assembly includes a ceramic top plate having a top surface with a processing region. One or more DC braze connections are within the 1-2 mm from surface of ceramic top plate. A plurality of mesas is within the processing region and on the top surface of the ceramic plate. None of the plurality of mesas are vertically over the one or more DC braze connections.

With reference again to FIGS. 1, 2A and 2B, in accordance with another embodiment of the present disclosure, a substrate support assembly includes a ceramic top plate having a top surface with a processing region. The top surface has one or more high topography regions. A plurality of mesas is within the processing region and on the top surface of the ceramic plate. None of the plurality of mesas are on the one or more high topography regions of the top surface of the processing region or above the high voltage electrode edge.

With reference again to FIGS. 1, 2A and 2B, in accordance with another embodiment of the present disclosure, a substrate support assembly includes a ceramic top plate having a top surface with a processing region. The top surface has one or more high stress regions. A plurality of mesas is within the processing region and on the top surface of the ceramic plate. None of the plurality of mesas are on the one or more high stress regions of the top surface of the processing region.

FIG. 2C illustrates a cross-sectional view of an electrostatic chuck (ESC) including mesas in various locations, in accordance with another embodiment of the present disclosure.

Referring to FIG. 2C, and ESC 270 includes a center zone 272, a main zone 274, a DC rod 276, and an ESC mesh 278. The DC rod 276 can be in a central location 280 as is depicted. The ESC 270 also includes mesas, such as mesas 282A, 282B, 282C and 282D. The mesa 282A is over a high voltage connection area 280 such as over DC rod 276. The mesa 282B is over an electrode edge. The mesa 282C is in a no electrode area. The mesa 282D is fully over an electrode. The mesas 282A, 282B, 282C and 282D are over a relatively shallow distance to the ESC mesh 278. In contrast to FIG. 2A, in an embodiment, the ESC 270 of FIG. 2C includes a molybdenum high voltage electrode mesh 278 joined by metal paste 290 through approximately 0.5 mm vias 292 to a brazed nickel rod 276 a few mm (e.g., 1-4 mm) inside the ceramic. In one such embodiment, the arrangement reduces the stress on the top while maintaining electrical connection from the nickel rod to molybdenum mesh through fine layers of paste in a horizontal mesh plane and in a vertical direction. In one embodiment, mesa 282D is in a relatively lower stress location than is mesa 212D of FIG. 2A.

Figure 3:
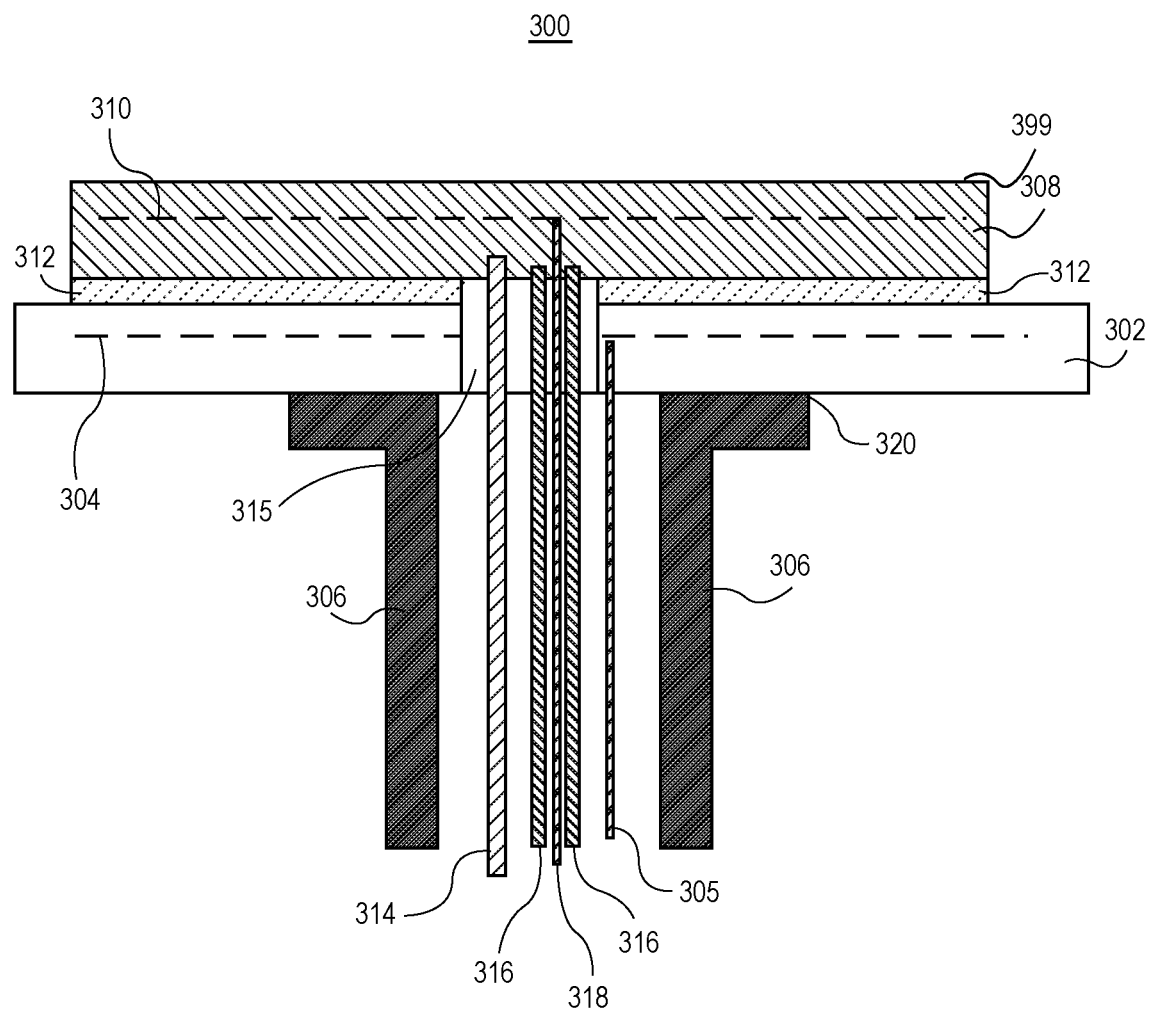
FIG. 3 illustrates a cross-sectional view of an electrostatic chuck (ESC), in accordance with an embodiment of the present disclosure.

Shown more generically, as an exemplary fabricated ESC, FIG. 3 illustrates a cross-sectional view of an electrostatic chuck (ESC), in accordance with an embodiment of the present disclosure.

Referring to FIG. 3, an ESC 300 includes a ceramic bottom plate 302 having heater coils 304 therein. The heater coils 304 can be coupled to a heater connection 305 (it is to be appreciated that in another embodiment, a heater electrode is screen printed in case of tape casted AlN or AlN plate material used for the ESC fabrication). A shaft 306 is coupled to a bottom surface of the ceramic bottom plate 302. The ESC 300 also includes a ceramic top plate 308. The ceramic top plate 308 has an ESC (clamping) electrode 310 or electrode assembly therein. A layer 312, such as a metal layer or a diffusion bond layer, can be used to bond the ceramic top plate 308 to a top surface of the ceramic bottom plate 302. A thermocouple 314 extends through an opening 315 in the ceramic bottom plate 302 and in metal layer 312. A high voltage insulation 316 extends through the opening 315 in the ceramic bottom plate 302 and in metal layer 312 and houses an ESC high voltage connection 318. A mesa covered surface 399 can be a mesa surface fabricated in accordance with embodiments described above.

With reference again to FIG. 3, in accordance with an embodiment of the present disclosure, a substrate support assembly 300 includes a ceramic bottom plate 302 having heater elements 304 therein. The substrate support assembly 300 also includes a ceramic top plate 308 having an electrode 310 therein. A metal layer 312 is between the ceramic top plate 308 and the ceramic bottom plate 302. The ceramic top plate 308 is in direct contact with the metal layer 312, and the metal layer 312 is in direct contact with the ceramic bottom plate 302.

The standard way of making ESC is in hot press by joining plates together and then diffusion bonding those plates to the shaft. In an embodiment without a diffusion bond, metal layer 312 provides for the incorporation of a metal bond in place of a ceramic to ceramic diffusion bond that can otherwise change a resistivity of a top ceramic during diffusion bond formation. In one embodiment, metal layer 312 is a metal foil, such as an aluminum foil. In one such embodiment, metal layer 312 is an aluminum foil impregnated with about 2% to 20% Si (e.g., as atomic % of total foil composition), with the remainder being aluminum or essentially all aluminum (i.e., the aluminum foil includes silicon having an atomic concentration in the range of 2%-20% of the aluminum foil). In an embodiment, metal layer 312 is pre-patterned, e.g., to include opening 315 and/or additional openings to accommodate lift pins, etc. In one embodiment, the metal layer 312 is an aluminum foil having a thickness in the range of 50-500 microns, and may be about 250 microns. In an embodiment, the metal layer 312 is an aluminum foil and is cleaned prior to inclusion in an ESC manufacturing process, e.g., to remove a passivation layer prior to bonding. In an embodiment, metal layer 312 is an aluminum foil and can sustain corrosive processes such as chlorine based process without etch or degradation of the metal layer 312 when the ESC is in use. However, if used for non-chlorine based processes, metal layer 312 may be composed of silver copper alloy, with or without addition of titanium, for example. In an embodiment, metal layer 312 is bonded to top plate 308 and bottom plate 302 at a temperature less than 600 degrees Celsius and, more particularly, less than 300 degrees Celsius. It is to be appreciated that higher ESC usage temperatures such as 650 degrees Celsius can be used if metal bonding is performed with a high temperature metal bond such as silver copper or gold nickel temperatures much lower than 1400 degrees Celsius but much above a 650 degrees Celsius usage temperature.

With reference to ceramic top plate 308 having the ESC (clamping) electrode 310 therein, in an embodiment, a body of the top plate may be formed by sintering a ceramic material, such as aluminum nitride (AlN) or aluminum oxide powder or other suitable material. An RF mesh can be is embedded in the body. The RF mesh can have electrical connections extending through a bottom surface of the body. The RF mesh may include molybdenum or another suitable metal material mesh about. In one embodiment, the mesh is an about 125 micron diameter mesh. The materials can be sintered to form a unitary structure. In one embodiment, the electrode 310 is fabricated from a metallic material, for example molybdenum, which may have a coefficient of thermal expansion similar to the body. In an embodiment, the ceramic top plate 308 is targeted for sustaining temperatures below 350 degrees Celsius, e.g., between 150-300 degrees Celsius, and may include dopants for optimizing such a targeted temperature range operation.

A clamping electrode 310 can include at least first and second electrodes. During operation, a negative charge may be applied to the first electrode and a positive charge may be applied to the second electrode, or vice versa, to generate an electrostatic force. During chucking, the electrostatic force generated from the electrodes holds a substrate disposed thereon in a secured position. As a power supplied from a power source is turned off, the charges present in an interface between the electrodes may be maintained over a long period of time. To release the substrate held on the electrostatic chuck, a short pulse of power in the opposite polarity may be provided to the electrodes to remove the charge present in the interface.

An electrode assembly may be formed by metallic bars, sheet, sticks, foil, and may be pre-molded, pre-casted and pre-manufactured and placed onto a surface of an insulating base during fabrication of the electrostatic chuck. Alternatively, a metal deposition process may be performed to deposit and form the electrode assembly directly on a top surface of an insulating base. Suitable deposition process may include PVD, CVD, plating, ink jet printing, rubber stamping, screen printing or aerosol print process. Additionally, metal paste/metal lines may be formed on a top surface of an insulating base. The metal paste/metal lines may initially be a liquid, paste or metal gel that may be patterned on to the object surface in a pattern to form electrode fingers with different configurations or dimensions on the top surface of the insulating base.

Ceramic top plate 308 or ceramic bottom plate 302 may include, but is not limited to, aluminum nitride, glass, silicon carbide, aluminum oxide, yttrium containing materials, yttrium oxide ($Y_2O_3$), yttrium-aluminum-garnet (YAG), titanium oxide (TiO), or titanium nitride (TiN). With reference to ceramic bottom plate 302, in an embodiment, the ceramic bottom plate 308 is targeted for sustaining temperatures up to 650 degrees Celsius, and may include dopants for optimizing such a targeted temperature range operation. In one embodiment, the ceramic bottom plate 302 has a different aluminum nitride composition than an aluminum nitride composition of the ceramic top plate 308. Heating elements 304 included in the ceramic bottom plate 302 may use any suitable heating techniques, such as resistive heating or inductive heating. The heating elements 304 may be composed of a resistive metal, a resistive metal alloy, or a combination of the two. Suitable materials for the heating elements may include those with high thermal resistance, such as tungsten, molybdenum, titanium, or the like. In one embodiment, heating elements 304 are composed of a molybdenum wire. The heating elements 304 may also be fabricated with a material having thermal properties, e.g., coefficient of thermal expansion, substantially matching at least one or both the aluminum nitride body to reduce stress caused by mismatched thermal expansion.

In an embodiment, ceramic top plate 308 is fabricated and then bonded to the ceramic bottom plate by the metal layer 312 (which may already include one or more openings patterned therein). In an embodiment, the metal layer 312 bonded to the ceramic top plate 308 at the same time as the metal layer 312 is bonded to ceramic bottom plate 302. In another embodiment, the metal layer 312 is first bonded to the ceramic top plate 308 and then the ceramic top plate/metal layer 312 pairing is bonded to ceramic bottom plate 302. In another embodiment, the metal layer 312 is first bonded to the ceramic bottom plate 302 and then the ceramic bottom plate/metal layer 312 pairing is bonded to ceramic top plate 308. In any case, in one particular embodiment, the ceramic top plate is formed from aluminum nitride (AlN) or aluminum oxide ($Al_2O_3$) powder and a metal mesh which are sintered.

In an embodiment, bonding the ceramic top plate 308 to the ceramic bottom plate 302 with the metal layer 312 includes heating the ceramic bottom plate 302, the metal layer 312, and the ceramic top plate 308 to a temperature less than 600 degrees Celsius. In an embodiment, the metal layer 312 is an aluminum foil, and the method includes cleaning a surface of the aluminum foil to remove a passivation layer of the aluminum foil prior to bonding the ceramic top plate 308 to the ceramic bottom plate 302 with the metal layer 312.

Figure 4:
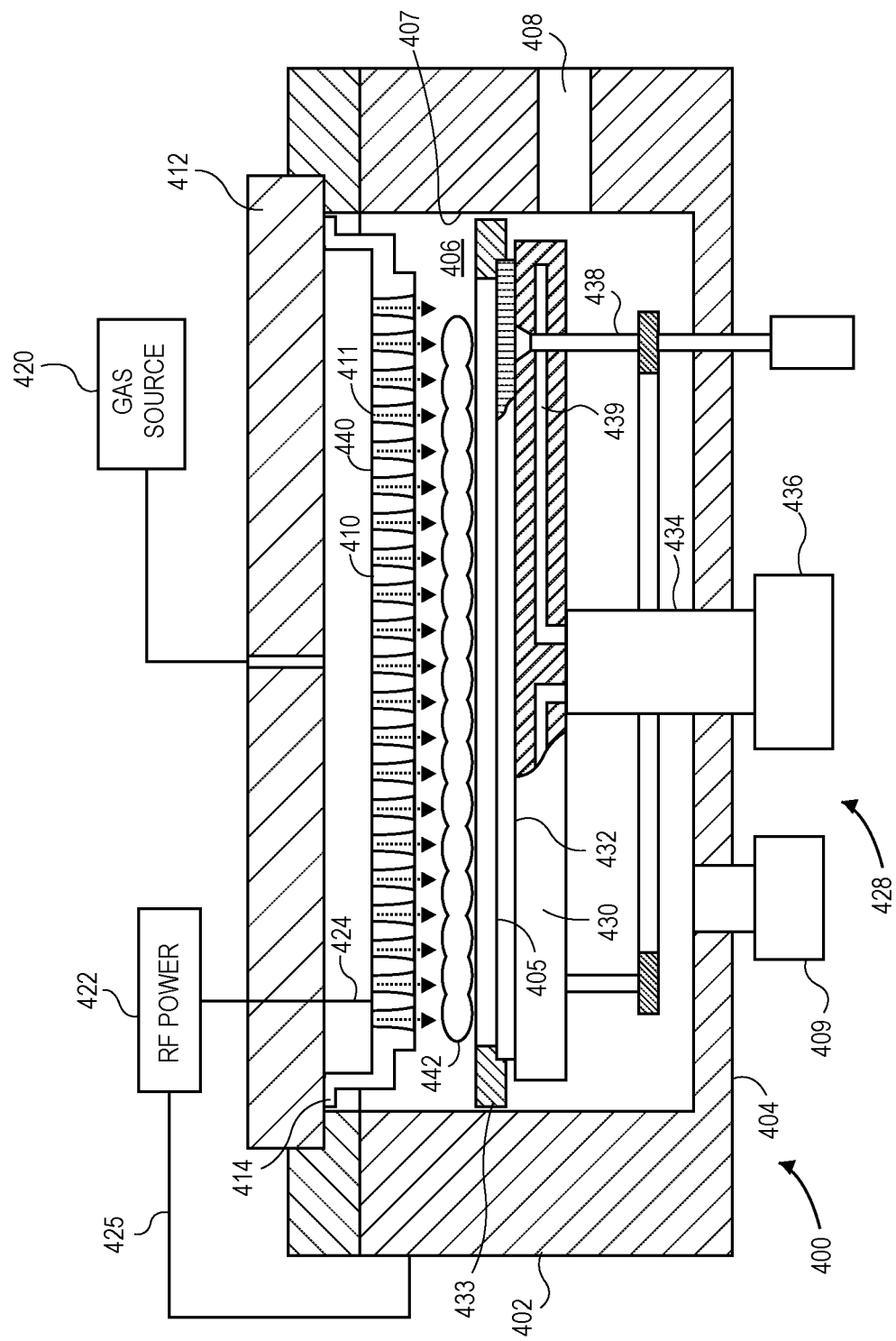
FIG. 4 is a schematic cross-sectional view of a process chamber including a substrate support assembly, in accordance with an embodiment of the present disclosure.

In another aspect, FIG. 4 is a schematic cross-sectional view of a process chamber 400 including a substrate support assembly 428, in accordance with an embodiment of the present disclosure. In the example of FIG. 4, the process chamber 400 is a plasma enhanced chemical vapor deposition (PECVD) chamber. As shown in FIG. 4, the process chamber 400 includes one or more sidewalls 402, a bottom 404, a gas distribution plate 410, and a cover plate 412. The sidewalls 402, bottom 404, and cover plate 412, collectively define a processing volume 406. The gas distribution plate 410 and substrate support assembly 428 are disposed in the processing volume 406. The processing volume 406 is accessed through a sealable slit valve opening 408 formed through the sidewalls 402 such that a substrate 405 may be transferred in and out of the process chamber 400. A vacuum pump 409 is coupled to the chamber 400 to control the pressure within the processing volume 406.

The gas distribution plate 410 is coupled to the cover plate 412 at its periphery. A gas source 420 is coupled to the cover plate 412 to provide one or more gases through the cover plate 412 to a plurality of gas passages 411 formed in the cover plate 412. The gases flow through the gas passages 411 and into the processing volume 406 toward the substrate receiving surface 432.

An RF power source 422 is coupled to the cover plate 412 and/or directly to the gas distribution plate 410 by an RF power feed 424 to provide RF power to the gas distribution plate 410. Various RF frequencies may be used. For example, the frequency may be between about 0.3 MHz and about 200 MHz, such as about 13.56 MHz. An RF return path 425 couples the substrate support assembly 428 through the sidewall 402 to the RF power source 422. The RF power source 422 generates an electric field between the gas distribution plate 410 and the substrate support assembly 428. The electric field forms a plasma from the gases present between the gas distribution plate 410 and the substrate support assembly 428. The RF return path 425 completes the electrical circuit for the RF energy prevents stray plasma from causing RF arcing due to a voltage differential between the substrate support assembly 428 and the sidewall 402. Thus the RF return path 425 mitigates arcing which causes process drift, particle contamination and damage to chamber components.

The substrate support assembly 428 includes a substrate support 430 and a stem 434. The stem 434 is coupled to a lift system 436 that is adapted to raise and lower the substrate support assembly 428. The substrate support 430 includes a substrate receiving surface 432 for supporting the substrate 405 during processing. Lift pins 438 are moveably disposed through the substrate support 430 to move the substrate 405 to and from the substrate receiving surface 432 to facilitate substrate transfer. An actuator 414 is utilized to extend and retract the lift pins 438. A ring assembly 433 may be placed over periphery of the substrate 405 during processing. The ring assembly 433 is configured to prevent or reduce unwanted deposition from occurring on surfaces of the substrate support 430 that are not covered by the substrate 405 during processing.

The substrate support 430 may also include heating and/or cooling elements 439 to maintain the substrate support 430 and substrate 405 positioned thereon at a desired temperature. In one embodiment, the heating and/or cooling elements 439 may be utilized to maintain the temperature of the substrate support 430 and substrate 405 disposed thereon during processing to less than about 800 degrees Celsius or less. In one embodiment, the heating and/or cooling elements 439 may be used to control the substrate temperature to less than 650 degrees Celsius, such as between 300 degrees Celsius and about 400 degrees Celsius. In an embodiment, the substrate support 430/substrate support assembly 428 is as described above.

Figure 5:
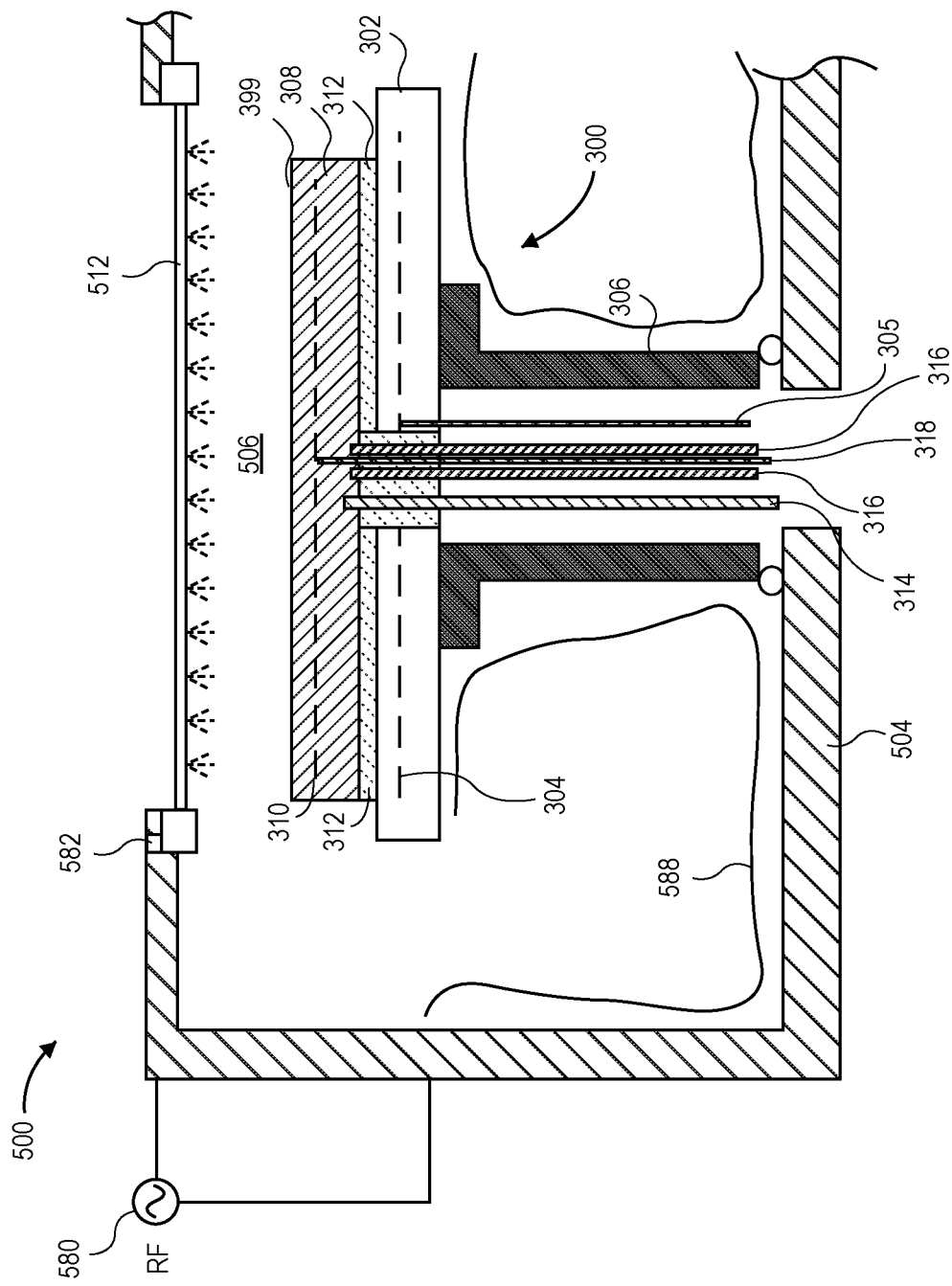
FIG. 5 is a partial schematic cross-sectional view of a processing chamber including a substrate support assembly, in accordance with an embodiment of the present disclosure.

In another aspect, FIG. 5 is a partial schematic cross-sectional view of a processing chamber 500 including the substrate support assembly 300, in accordance with an embodiment of the present disclosure. The processing chamber 500 has a body 501. The body has sidewalls 502, a bottom 504 and a showerhead 512. The sidewalls 502, bottom 504 and showerhead 512 define an interior volume 506. In an embodiment, a substrate support assembly 300, such as described above, is disposed within the interior volume 506. A RF generator 580 may be coupled an electrode 582 in the showerhead 512. The RF generator 580 may have an associated RF return path 588 for completing the RF circuit when plasma is present. Advantageously, an RF ground path for maintaining the plasma can be maintained and provide a long service life for the substrate support assembly 300.

In an embodiment, a semiconductor wafer or substrate supported by substrate support assembly 300 is composed of a material suitable to withstand a fabrication process and upon which semiconductor processing layers may suitably be disposed. For example, in one embodiment, a semiconductor wafer or substrate is composed of a group IV-based material such as, but not limited to, crystalline silicon, germanium or silicon/germanium. In a specific embodiment, the semiconductor wafer includes is a monocrystalline silicon substrate. In a particular embodiment, the monocrystalline silicon substrate is doped with impurity atoms. In another embodiment, the semiconductor wafer or substrate is composed of a III-V material.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with process chamber 400 and substrate support assembly 428 described above in association with FIG. 4 or with processing chamber 500 and substrate support assembly 300 described in association with FIG. 5. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
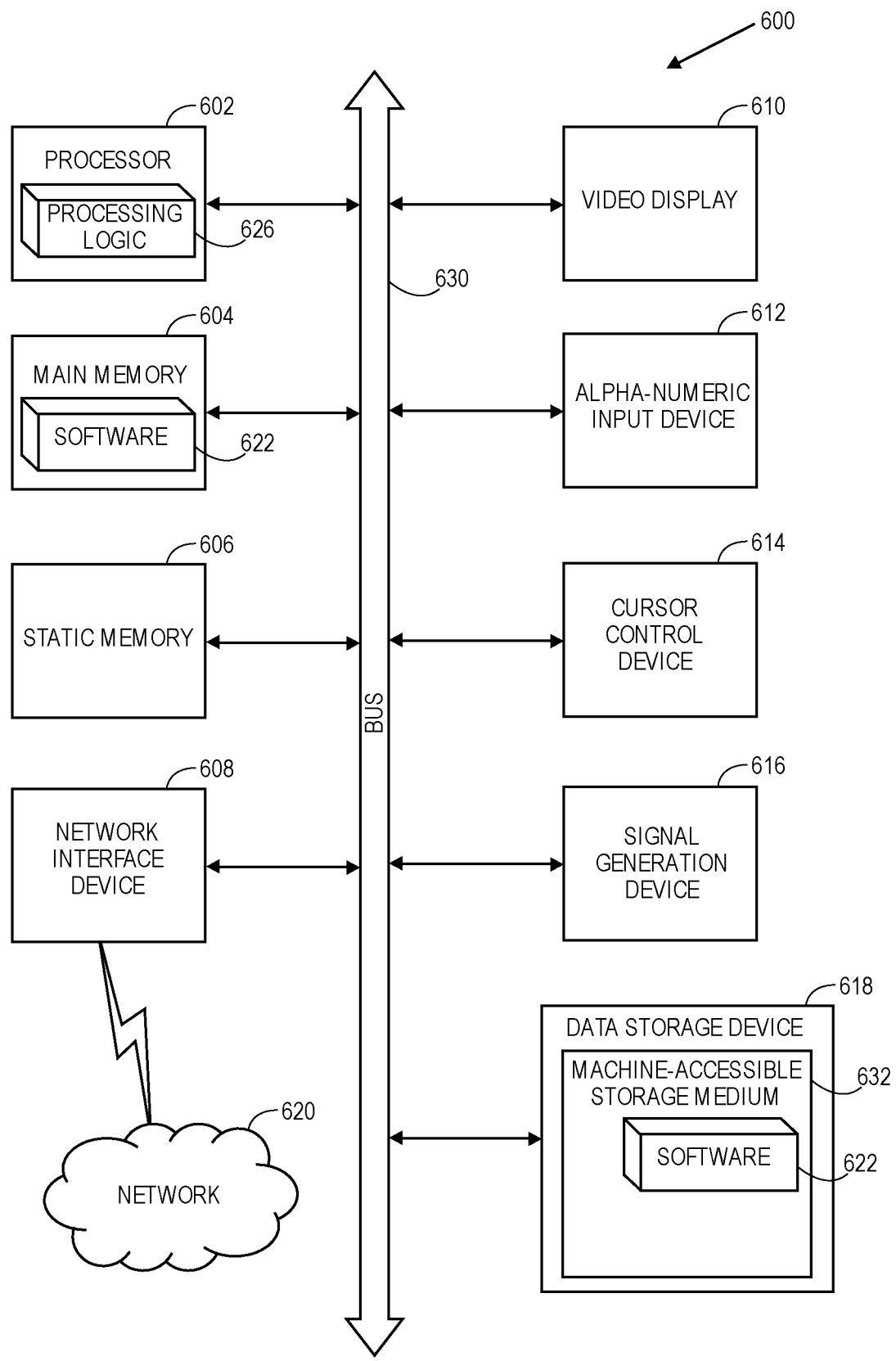
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

Thus, electrostatic chucks (ESCs) for plasma processing chambers, and methods of fabricating ESCs, have been disclosed.

What is claimed is:

1. A substrate support assembly, comprising:
a ceramic top plate having a top surface with a processing region;
one or more electrodes within the ceramic top plate; and
a plurality of mesas within the processing region and on the top surface of the ceramic top plate, wherein all of the plurality of mesas are fully over a corresponding one of the one or more electrodes.

2. The substrate support assembly of claim 1, wherein the plurality of mesas is continuous with the top surface of the ceramic top plate.

3. The substrate support assembly of claim 1, wherein the ceramic top plate comprises aluminum nitride.

4. The substrate support assembly of claim 1, wherein the ceramic top plate comprises aluminum oxide.

5. The substrate support assembly of claim 1, wherein the one or more electrodes comprise molybdenum.

6. A substrate support assembly, comprising:
a ceramic top plate having a top surface with a processing region;
a molybdenum mesh within the ceramic top plate; and
a plurality of mesas within the processing region and on the top surface of the ceramic top plate, wherein all of the plurality of mesas are fully over the molybdenum mesh.

7. The substrate support assembly of claim 6, wherein the ceramic top plate comprises aluminum nitride.

8. The substrate support assembly of claim 6, wherein the ceramic top plate comprises aluminum oxide.

9. A substrate support assembly, comprising:
a ceramic top plate having a top surface with a processing region, the top surface having one or more high topography regions and one or more electrodes within the ceramic top plate; and
a plurality of mesas within the processing region and on the top surface of the ceramic top plate, wherein all of the plurality of mesas are fully over a corresponding one of the one or more electrodes.

10. The substrate support assembly of claim 9, wherein the plurality of mesas is continuous with the top surface of the ceramic top plate.

11. The substrate support assembly of claim 9, wherein the ceramic top plate comprises aluminum nitride.

12. The substrate support assembly of claim 9, wherein the ceramic top plate comprises aluminum oxide.

13. The substrate support assembly of claim 9, further comprising one or more electrodes comprising molybdenum.

14. A substrate support assembly, comprising:
a ceramic top plate having a top surface with a processing region, the top surface having one or more stress regions;
one or more electrodes within the ceramic top plate; and
a plurality of mesas within the processing region and on the top surface of the ceramic top plate, wherein all of the plurality of mesas are fully over a corresponding one of the one or more electrodes.

15. The substrate support assembly of claim 14, wherein the plurality of mesas is continuous with the top surface of the ceramic top plate.

16. The substrate support assembly of claim 14, wherein the ceramic top plate comprises aluminum nitride.

17. The substrate support assembly of claim 14, wherein the ceramic top plate comprises aluminum oxide.

18. The substrate support assembly of claim 14, further comprising one or more electrodes comprising molybdenum.

* * * * *